United States Patent [19]

Kohn

[11] Patent Number: 4,604,966
[45] Date of Patent: Aug. 12, 1986

[54] CONTINUOUS SOLDER PASTE DISPENSER
[75] Inventor: Harold Kohn, Endwell, N.Y.
[73] Assignee: International Business Machine Corp., Armonk, N.Y.
[21] Appl. No.: 786,225
[22] Filed: Oct. 10, 1985
[51] Int. Cl.⁴ .............................................. B05C 5/02
[52] U.S. Cl. ................................... 118/406; 101/120; 118/213
[58] Field of Search ............... 118/213, 406; 101/119, 101/120, 124

[56] References Cited

U.S. PATENT DOCUMENTS

| | | | |
|---|---|---|---|
| 2,928,340 | 3/1960 | Stein et al. | 118/406 X |
| 3,735,730 | 5/1973 | Mitter | 101/120 X |
| 4,023,487 | 5/1977 | Mitter | 101/120 |
| 4,090,654 | 5/1978 | Volkert | 228/40 |
| 4,103,615 | 8/1978 | Cruz et al. | 101/120 |
| 4,478,882 | 10/1984 | Roberto | 427/97 |

Primary Examiner—John P. McIntosh
Attorney, Agent, or Firm—Perman & Green

[57] ABSTRACT

Apparatus for applying solder paste to printed circuit boards ("PCB's") in a continuous operation. A drum containing solder paste is positioned over a work station and has an outlet slot through which the solder paste can be discharged onto the surface of a PCB as it advances through the work station. A stencil formed with a desired pattern for application of the solder paste to the PCB is rotatably mounted on the outer surface of the drum and overlies the outlet slot. Gravity, machine vibration, and, if desired, air pressure are effective to discharge the solder paste onto the PCB with the aid of a resilient squeegee pad adjacent the outlet slot. A drive mechanism directly couples the translational movement of the PCB through the work station with the rotational movement of the stencil at the work station.

12 Claims, 8 Drawing Figures

CONTINUOUS SOLDER PASTE DISPENSER

BACKGROUND OF THE INVENTION

1. Field of the Invention

The present invention relates generally to apparatus for applying solder paste to printed circuit boards and, more particularly, to high speed apparatus which applies solder paste to printed circuit boards in a continuous operation.

2. Description of the Prior Art

In the early days of operations with printed circuit boards ("PCB's") or so called thick film circuitry, it was customary to mount components by the pin in hole method. This remains the most common method presently utilized. According to this technique the board must be punched or drilled in appropriate locations to receive the leads from the various components to be mounted. Solder is then manually introduced into each hole in order to electrically connect this component with the remainder of the circuitry on the board. This is a costly and time consuming process which substantially increases the cost of the end item being manufactured.

Other techniques have been attempted and utilized in an effort to increase the speed of the manufacturing process. Typical of these is the "drag bath" process according to which the board is dragged or pulled at low speed over the surface of the solder bath such that substantially its entire under surface touches the fluid solder. At the end of its passage over the solder, the board is removed. A typical form of apparatus for performing the drag bath process is disclosed in U.S. Pat. No. 4,090,654 to Volkert.

A similar process is referred to as "wave soldering" according to which the printed circuit board to which components are to be attached by soldering is carried over a wave of solder which is created by steady agitation of the fluid solder in a bath. A short but wide stationary wave of solder is created within the bath. A printed circuit board is passed over the wave which splashes the board as it passes over the wave, touching it at its underside, in a line, which sweeps along the whole of its underside. The advantage of this method is that a relatively small amount of heat is transferred to the printed circuit board. A disadvantage of this method is that the fluid solder which has a tendency to oxidize, becomes oxidized more quickly in view of the steady agitation.

Relatively common throughout the industry at the present time are printing machines that screen solder paste to printed circuit boards. These are generally of the clam shell design. The clam shells open and close on a hinged bearing with the PCB positioned under the top half of the clam shell, the unit is closed.

Then, a rubber wipe slides across a stencil on which the solder paste is positioned and this paste is pushed through the stencil onto the PCB. The clam shell mechanism then opens, the PCB is removed, and the cycle is repeated. Although effective in achieving the end result, this method is a slow, discontinuous one, time consuming and, therefore, expensive.

In other industries, namely, in the textile industry and in the paper making industry, screen printing machines have become popular for printing for fabrics such as woven and knitted fabrics, fibrous webs, paper, synthetic plastic foil, carpets, rugs and the like in a continuing process. An example of an ink dispensing arrangement for use in such a machine is disclosed in U.S. Pat. No. 4,023,487 to Mitter. While the Mitter device appears to be desirable for its intended purpose, it is not designed for, nor capable of, operating with the solder paste utilized in the instance of printed circuit boards.

Examples of successful machines which exhibit the clam shell design are the DEK Model 200 manufactured by Universal Instruments Company of Binghamton, N.Y. and Model No. American Tempo 2230 manufactured by Advanced Process Supply Company of Chicago, Ill.

SUMMARY OF THE INVENTION

It was with knowledge of the prior art, as just described, and the problems then existing which gave rise to the present invention. In brief, the present invention is directed towards apparatus for applying solder paste to PCB's in a continuous operation. A drum containing solder paste is positioned over a work station and has an outlet slot through which the solder paste can be discharged onto the surface of a PCB as it advances through the work station. A stencil formed with a desired pattern for application of the solder paste to the PCB is rotatably mounted on the outer surface of the drum and overlies the outlet slot. Gravity, machine vibration, and, if desired, air pressure are effective to discharge the solder paste onto the surface of the PCB with the aid of a resilient squeegee pad adjacent the outlet slot. A drive mechanism directly couples the translational movement of the PCB through the work station with the rotational movement of the stencil at the work station.

By reason of the stencil being mounted in a cylindrical plane which approaches tangency with the PCB, the invention results in a larger "off contact printing" angle than is achieved by the clam sheel design of the prior art. That is, it was not unusual, when utilizing prior art methods and apparatus, for the solder paste to be undesirably stripped away from the surface of the PCB as the stencil is withdrawn from the surface of the PCB. Furthermore, the angle of the resilient squeegee pad which is an intergal element of the present invention can be selectively adjusted to accommodate solder pastes of different viscosities.

Other and further features, objects, advantages, and benefits of the invention will become apparent from the following description is taken in conjunction with the following drawings. It is to be understood that both the foregoing general description and the following detailed description and exemplary and explanatory but not restrictive of the invention. The accompanying drawings, which are incorporated in and constitute a part of the invention, illustrate some of the embodiments of the invention and, together with the description, serve to explain the principles of the invention in general terms.

DESCRIPTION OF THE PREFERRED EMBODIMENT

Figure 1:
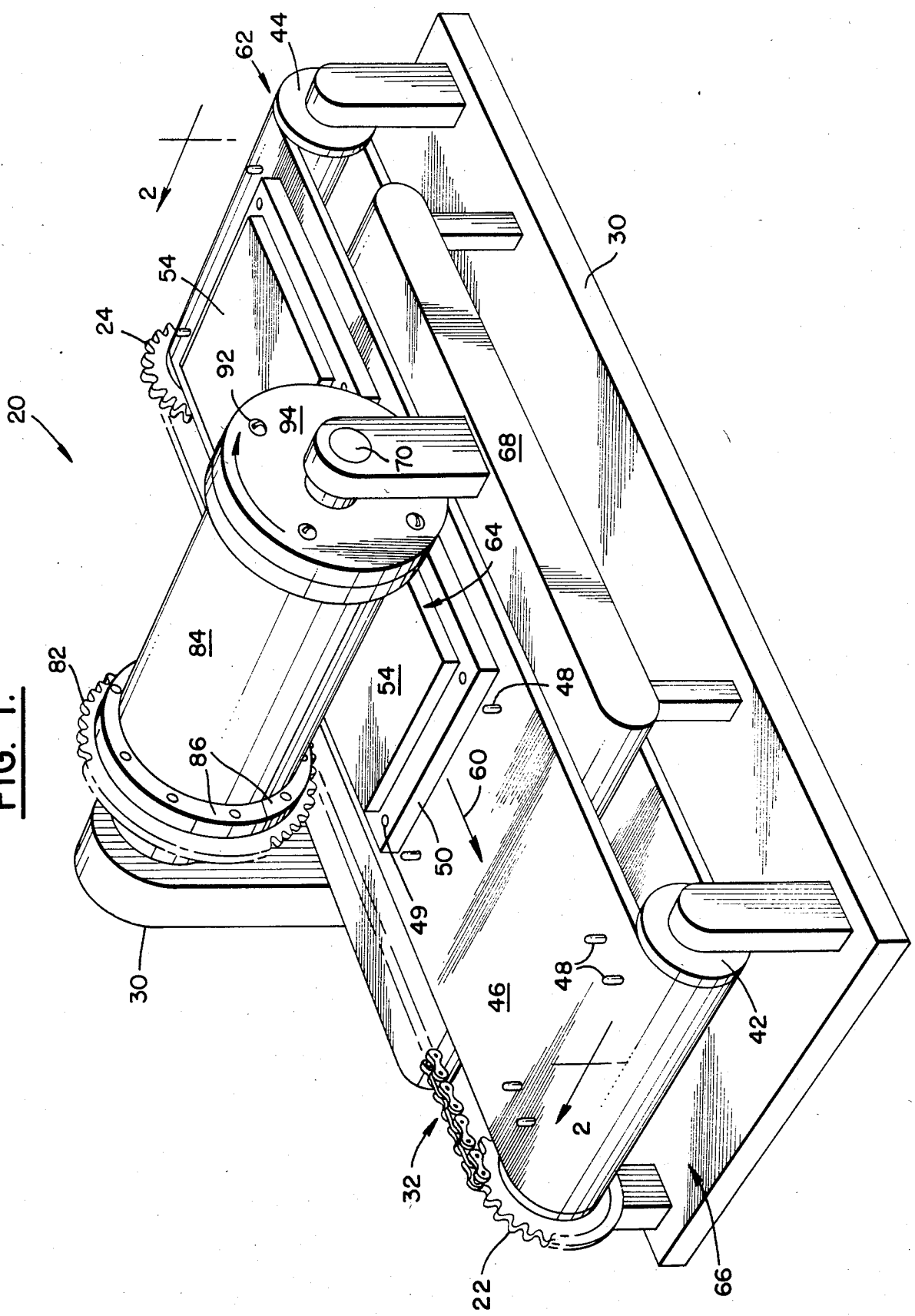
FIG. 1 is a perspective view of a continuous solder paste printing machine embodying the present invention.
Figure 2:
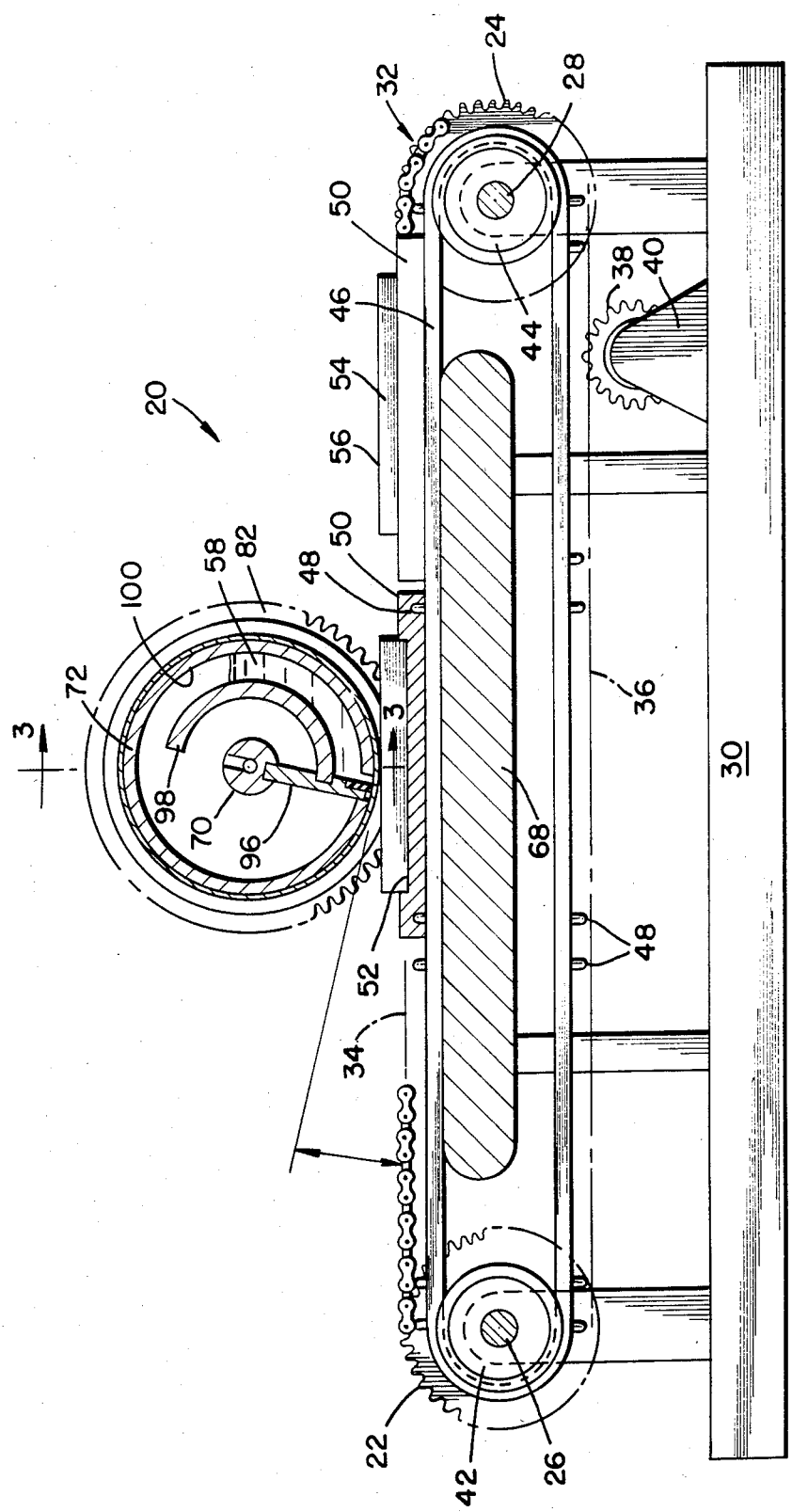
FIG. 2 is a cross section view taken generally along line 2—2 in FIG. 1.

Turn now to the drawings and initially to FIGS. 1 and 2 which illustrate a continuous solder paste printing machine 20 embodying the present invention. It will be appreciated that the machine 20 is illustrated in a diagrammatic form in order to explain its operation in an easily understandable manner. However, in actual practice, the shape and size of the machine 20 might be substantially different from that illustrated and yet be within the scope of the covered invention.

A pair of spaced apart sprockets 22 and 24 are rotatably mounted on axles 26 and 28 respectively supported on a frame structure 30. A continuous roller chain 32 engages the sprockets 22 and 24 and extends therebetween along an upper loop 34 and lower loop 36. The lower loop 36 is engaged by a driver sprocket 38 (FIG. 2) driven by a motor or other suitable prime mover indicated by a reference numeral 40.

A pair of pulleys 42 and 44 share, respectively, the axles 26 and 28 with the sprockets 22 and 24. The pulleys are fixed to their respective axles as are the sprockets so that they rotate in a unitary fashion with the sprockets. A precision continuous chain link belt 46 is drivingly engaged with the pulleys 42 and 44 and extends therebetween in a fashion similar to the roller chain 32.

A plurality of drive pins 48 are fixed to the belt 46 at laterally and longitudinally spaced locations along the belt. In a preferred construction, a set of four such drive pins 48 can engage with accurately located mating holes 49 formed in a fixture 50. The fixture 50 may be recessed as indicated at 52 (FIG. 2) so as to accurately position thereon a printed circuit board 54 on an upper surface 56 of which solder paste 58 is to be applied. As the link belt 46 advances in the direction of an arrow 60 (FIG. 1), an operator can place conbinations of a fixture 50 and printed circuit board 54 onto the belt 46 in an inlet end 62 of the machine 20. This enables the printed circuit boards to pass through a work station 64 intermediate the sprockets 22 and 24. After the solder paste 58 has been applied to the upper surface 56 and the work station 64 in a manner to be described, an operator can then remove each combination of a fixture 50 and a printed circuit board 54 before it reaches an outlet end 66 of the machine 20. In order to assure the horizontal positioning of the printed circuit board 54 as it passes through the work station 64, a platform 68 of any suitable design is provided integral with the frame structure 30. An upper loop of the belt 46 glides across an upper surface of the platform 68 thereby preventing sagging of the belt between the inlet end 62 and the outlet end 66.

As seen especially in FIGS. 1 and 2, a shaft 70 is mounted at its ends to the frame structure 30 and extends across the link belt 46 at the work station 64. The longitudinal axis of the shaft 70 is preferably parallel to that of the axles 26 and 28. A cylindrical drum or receptacle 72 has a curved outer surface 74 and integral end walls 76 (FIG. 3) which are pierced at 78 to receive the shaft 70 but are firmly fixed thereto in any suitable manner. The outer surface 74 is discontinuous in that the drum 72 is formed with a transversely extending slot 80 adjacent the work station 64. Preferably, a longitudinal axis of the slot 80 is substantially parallel to the axis of the shaft 70.

Figure 3:
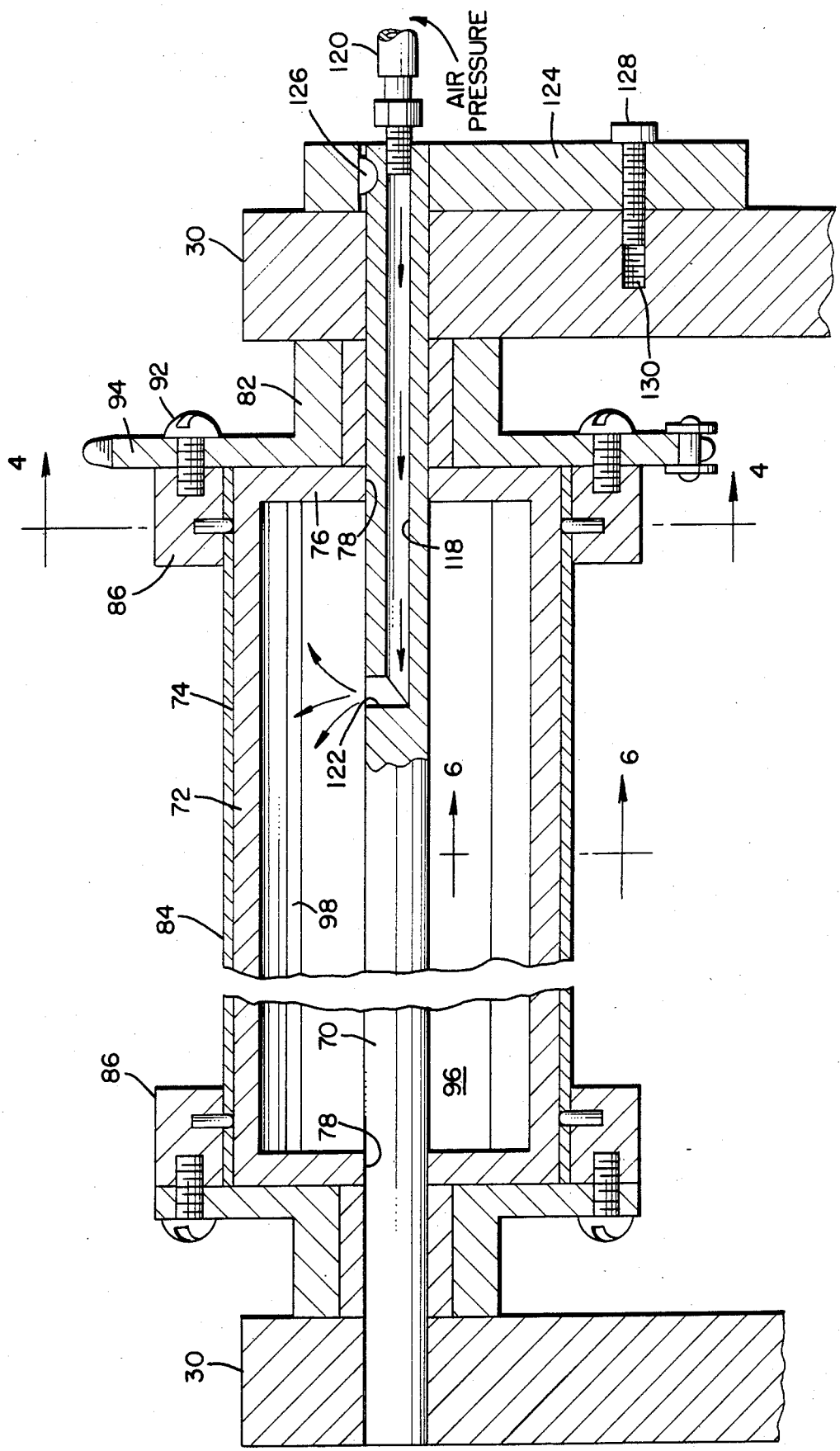
FIG. 3 is a cross section view taken generally along line 3—3 in FIG. 2 to illustrate in detail a component of the machine.

A sprocket 82 is journaled on the shaft 70 intermediate the frame structure 30 and the drum 72 at one end of the drum as illustrated in FIG. 3. Preferably, the sprocket 82 is butted against the frame structure 30 and also abuts the endwall 76. The sprocket 82 is engaged with the chain 32 and is caused to rotate as the chain advances.

Figure 4:
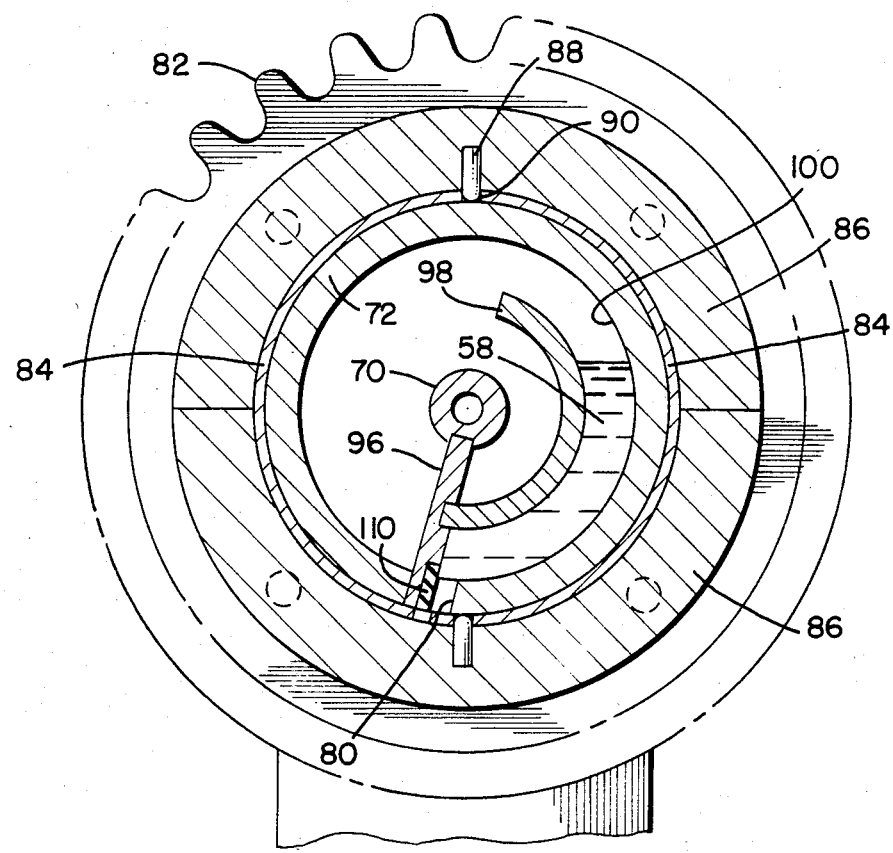
FIG. 4 is a cross section view taken generally along line 4—4 in FIG. 3.

A stencil plate 84 of any suitable thickness and material is then wrapped around the drum 72 and held in position thereon at its ends by a pair of collar members 86. A preferred material for the stencil plate 84 is beryllium copper which has been suitably etched with a pattern of the form which it is desired to impart to the upper surface 56 of the printed circuit board 54. A typical thickness for the stencil plate is 0.005 inches. As best illustrated in FIG. 4, the collar member 86 may be constructed in two halves each of which has the same curvature as the outer surface of the stencil plate 84 when positioned on the drum 72. Each half of the collar member 86 may be provided with a radially inwardly extending peg 88 integral therewith and extending into a mating depression 90 in the stencil plate 84. Appropriate fasteners such as screws 92 would be received through a flange 94 of the sprocket 82 and threadedly engaged with the collar member 86 so as to firmly mount the collar member to the sprocket 82 and, in turn, hold the stencil plate 84 fixed relative to the sprocket 82. At the same time, however, the stencil plate 84 remains slidingly received on the outer surface 74 of the drum 72.

Figure 5:
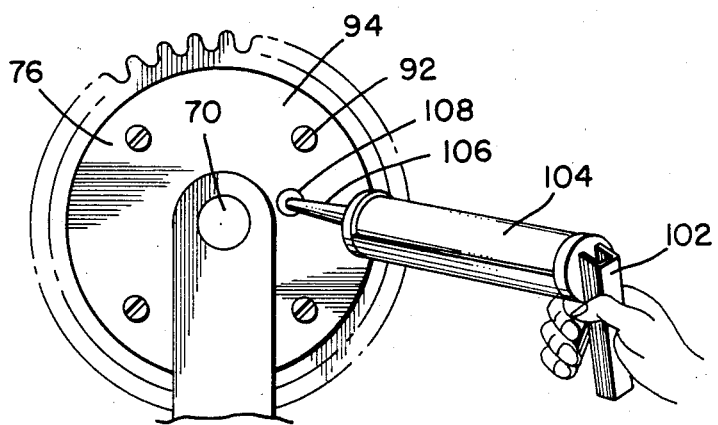
FIG. 5 is a detail side elevation view of a component of the machine.

A squeegee blade or plate 96 is fixed, as by welding, to the shaft 70 and extends downwardly therefrom into the slot 80. A curved plane inner wall member 98 is also fixed as by welding along one edge to the squeegee blade 96 at a location distant from the slot 80. The inner wall member 98 extends the length of the drum 72 (FIG. 3), is fixed to the endwalls 76, as by welding, and may be generally concentric with the drum. As seen particularly in FIGS. 2 and 4, the drum 72 and the inner wall member 98 thereby define a passageway 100 which leads to the slot 80. The solder paste 58 can be injected into the passageway 100 in any suitable fashion. As illustrated diagrammatically in FIG. 5, a suitable gun 102 can direct the solder paste from a cartridge 104 through a nozzle 106 inserted into an appropriate opening 108 through the endwall 76 of the drum 72. Such injection can be performed periodically on an as needed basis.

Figure 6:
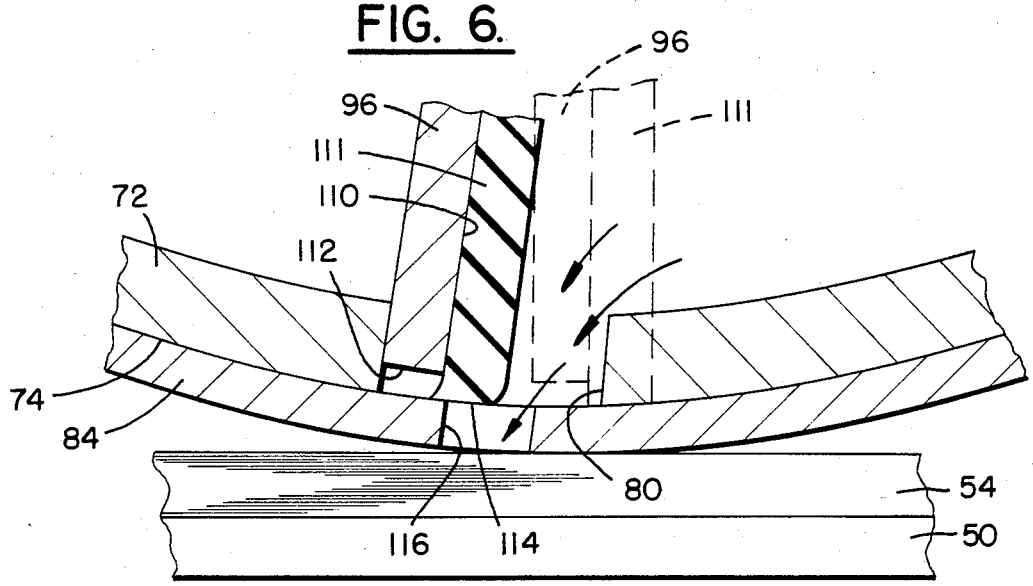
FIG. 6 is a detail cross section view taken generally along line 6—6 in FIG. 3.

At its lower regions, the surface of the squeegee blade 96 which faces the solder paste 58 within the passageway 100 is notched out as at 110 (FIG. 6) to provide for a resilient squeegee pad 111 to be placed therein. The pad 111 may be composed of any suitable material such as silicon rubber and would be held in place by a suitable adhesive. While a lower edge 112 of the squeegee blade 96 extends into the slot 80, a lower edge 114 of the squeegee pad 111 extends, perhaps, a few thousandths of an inch beyond the lower edge 112 and even slightly beyond the outer surface 74 of the drum 72.

Figure 7:
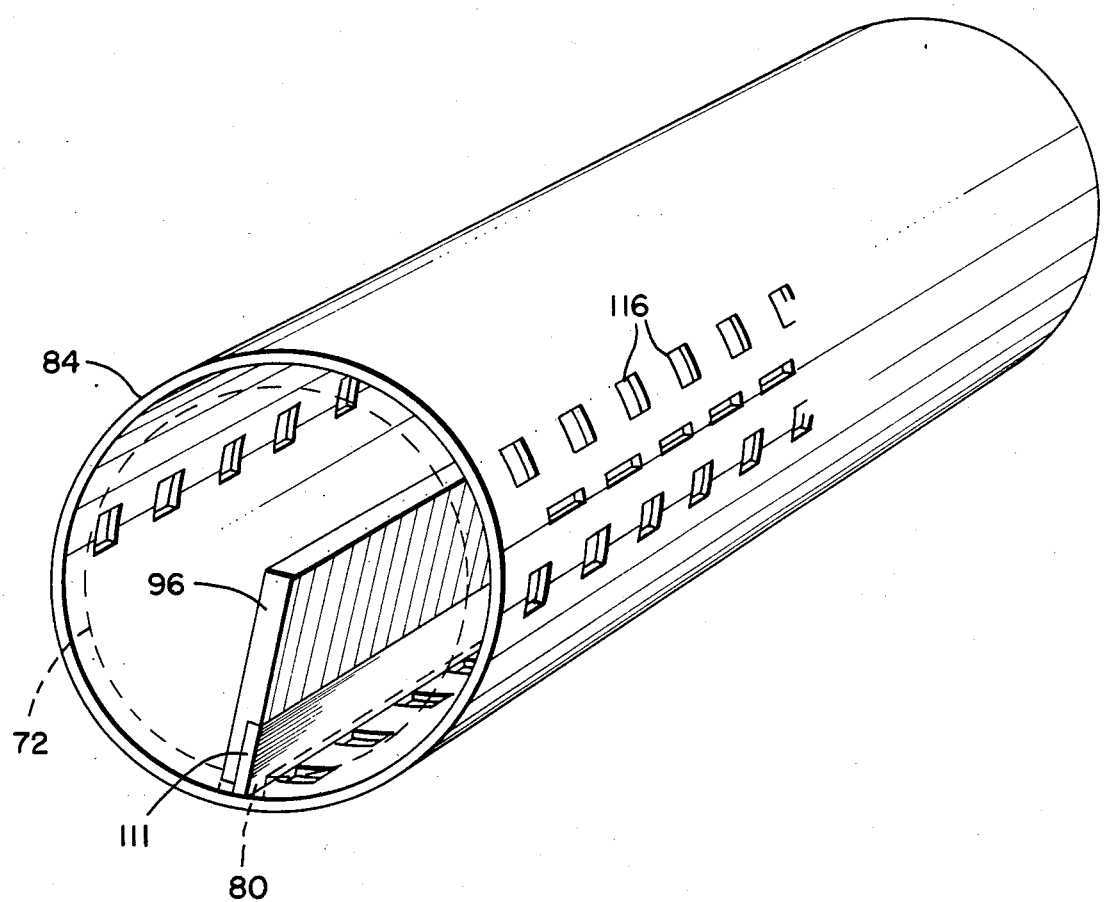
FIG. 7 is a detail perspective view of cooperating components of the machine.

By reason of gravity and vibration generated upon operation of the machine 20, the solder paste 58 descends through the passageway 100 toward and through the slot 80. It impinges on the outer surface of the squeegee blades 96 and, especially of the squeegee pad 111. The squeegee pad 111 serves as a seal keeping solder paste from wiping or wedging between the drum 72 and the stencil plate 84. The solder paste is thus driven through the opening 80 and, particularly, through etched openings 116 formed in the stencil plate 84 (see FIGS. 6 and 7). This causes the solder paste 58 to be deposited onto the upper surface 56 of the printed circuit board 54. The solder paste so deposited will exhibit the pattern formed in the stencil plate 84.

Turning again to FIG. 3, it is seen that the shaft 70 may be provided with an axial bore 118 suitably connected to a source 120 of air pressure. The bore 118 terminates at a radially directed nozzle 122 such that pressurized air can be directed into the interior of the drum 72. It may be desirable to supplement gravity and machine vibration with air pressure to cause flow of the solder paste 58 downwardly through the slot 80.

Figure 8:
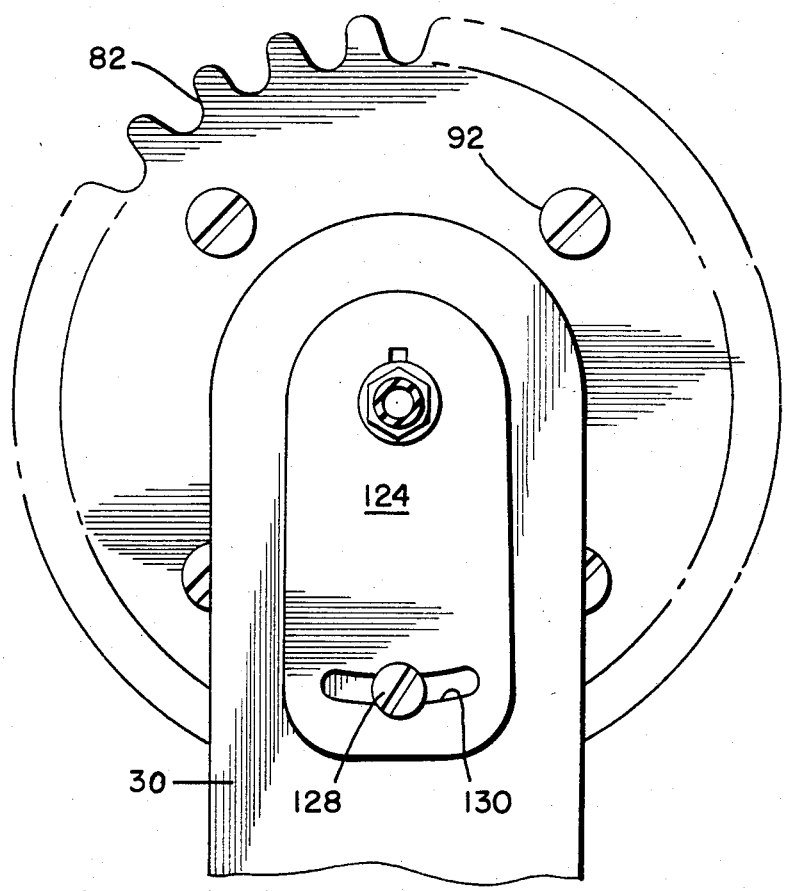
FIG. 8 is an end elevation view of the component illustrated in FIG. 3.

It was previously explained that the shaft 70 is mounted on and extends between portions of the frame structure 30. The shaft is not fixed on the frame structure 30 but can rotate thereon through a limited arc. An arc plate 124 may be fixed to the shaft 70 by means of a key 126. Distant from the shaft 70, a set screw 128 extends through the arc plate 124 and is selectively engageable with an arcuate groove 130 formed in the frame structure 30 (FIG. 8).

A particular feature of the present invention is that as the solder paste 58 is applied to the upper surface 56 of the printed circuit board 54, the stencil plate 84 is gently withdrawn by reason of its cylindrical shape. It can be said that the invention provides a large "off contact printing" angle because of the cylinder to flat surface design. The least angle would be provided when the squeegee blade is positioned in a plane which is perpendicular to the upper surface 56 but is increased when the plane of the squeegee blade 96 is tipped as indicated in FIG. 4 to thereby form an acute angle with a vertical plane. The position of the squeegee blade illustrated in FIG. 4 is preferred when solder paste of a higher viscosity is being applied by the machine 20 and the vertical plane position illustrated in dotted lines may be employed when solder paste of a lower viscosity is used.

In operation, then, an operator places a printed circuit board 54 onto a fixture 50 within the confines of the recess 52. He then places that combination onto the link belt 46 so that holes 49 on the fixture 50 register with the drive pins 48. This is accomplished at the inlet end 62 to the machine 20 and a continuing series of fixture and printed circuit board combinations would be so mounted on the link belt 46 with continued operation of the machine. At the same time an appropriate stencil plate 84 is mounted on the drum 72, possibly after removal of a former stencil plate having a pattern no longer desired. As each printed circuit board 54 comes into registry with the slot 80 at the work station 64, the solder paste 58 is applied to the upper surface 56 and is formed thereon according to the pattern formed on the stencil plate 84. By reason of the sprocket 82, the stencil plate 84 is moved in a coordinated fashion with the printed circuit board 54. As a portion of the stencil plate 84 completes its passage with respect to the slot 80, the rotation of the stencil plate relative to the surface 74 of the drum 72 causes the stencil plate to be gently lifted away from the upper surface 56 without drawing with it the solder paste which has just been applied. When the printed circuit board has passed fully through the work station 64 and approaches the outlet end 66, an operator removes the fixture 50 with its printed circuit board 54 thereon and transfers the circuit board to another location for further processing.

While the preferred embodiments of the invention have been disclosed in detail, it should be understood by those skilled in the art that various modifications may be made to the illustrated embodiments without departing from the scope of the invention as described in the specification and defined in the appended claims.

I claim:

1. Apparatus for applying solder paste to printed circuit boards in a continuous operation comprising:
    a receptacle for containing solder paste, said receptacle being positioned above a work station and having an inlet for receiving the solder paste therethrough, an outlet for discharging the solder paste at the work station, and a passageway connecting the inlet to the outlet;
    support means mounting said receptacle above the work station;
    drive means for advancing a printed circuit board through the work station so that it can receive thereon the solder paste from said receptacle;
    stencil means defining a desired pattern of the solder to be applied to the printed circuit board, said stencil means being mounted on said receptacle overlying the outlet and movable relative thereto in a timed relationship with movement of the printed circuit board; and
    a rigid squeegee blade defining a boundary of said passageway integral with said support means and lying generally in a vertical plane and having a forward face and a lower edge extending into the outlet and having a resilient pad fixed on the lower regions of said forward face and extending beyond said lower edge;
    whereby the solder paste in said receptacle is caused to flow by gravity and by vibration occurring with operation of said apparatus through said passageway against said squeegee blade including said pad, said pad being operable, by reason of its resiliency, to drive the solder paste through said stencil and onto the printed circuit board, thereby creating a pattern of the solder paste on the printed circuit board as defined by said stencil means.

2. Apparatus as set forth in claim 1 wherein:
    said receptacle is a cylindrical drum and has an outer surface; and
   wherein:
    said stencil means is a sheet of flexible material wrapped around said outer surface in a contiguous relationship;
    said apparatus including:
    retainer means for releasably mounting said stencil means on said drum and joining said stencil means to said drive means for movement therewith.

3. Apparatus as set forth in claim 2 including a curved plane inner wall member fixed along one edge to said squeegee blade at a location distant from the outlet and spaced from said resilient pad and generally concentric with said drum, said drum and said inner wall member defining the passageway connecting the inlet to the outlet.

4. Apparatus as set forth in claim 3 wherein said support means includes a substantially horizontal shaft; and wherein:

said drum is concentric with said shaft.

5. Apparatus as set forth in claim 4 wherein said shaft has an axial bore therein terminating at a radially directed nozzle communicating with the interior of said drum, said apparatus including a source of pressurized air connected with the bore to aid in causing flow of the solder paste through the outlet.

6. Apparatus as set forth in claim 3 wherein said support means includes:

a pair of spaced apart frame members and a shaft having a substantially horizontal axis journaled therebetween, said drum being concentric with said horizontal axis.

7. Apparatus as set forth in claim 6 wherein:

said squeegee blade is selectively movable about said horizontal axis between a substantially vertical plane and a tipped plane forming an acute angle with the vertical plane in the direction of movement of the printed circuit board through the work station.

8. Apparatus as set forth in claim 7 including:

a flange fixed to said shaft adjacent one of said frame members and fastener means for releasably joining said flange to said associated frame member at any one of a plurality of positions of said squeegee blade between the vertical plane and the tipped plane.

9. Apparatus as set forth in claim 6 wherein said drive means includes:

a pair of spaced apart sprockets rotatable on axes parallel to said horizontal axis;

an endless chain drivingly engaged with said sprockets and extending therebetween;

a pair of spaced apart pulleys rotatable on axes concentric with said sprockets;

endless belt means drivingly engaged with said pulleys and extending therebetween;

a plurality of drive pins fixed to said belt and extending outwardly therefrom;

and wherein said apparatus includes:

a fixture adapted to be received on said belt means and having holes therein for engageably receiving said drive pins, said fixture having an upper surface for receiving a printed circuit board thereon for movement through the work station as said fixture advances on said belt means.

10. Apparatus as set forth in claim 9 including:

a platform for supporting said belt means intermediate said pulleys proximate to the work station.

11. Apparatus as set forth in claim 9 including:

a third sprocket rotatably mounted on said shaft adjacent the work station and engageable with said chain; and wherein:

said retainer means is a collar member releasably engageable with said third sprocket and releasably engageable with said stencil means whereby rotation of said third sprocket resulting from movement of said chain is directly transmitted to said stencil means.

12. Apparatus as set forth in claim 1 wherein the outlet is elongated and extends transverse of the direction of movement of the printed circuit board through the work station.

* * * * *